United States Patent [19]

Nakamura et al.

[11] Patent Number: 4,495,546
[45] Date of Patent: Jan. 22, 1985

[54] HYBRID INTEGRATED CIRCUIT COMPONENT AND PRINTED CIRCUIT BOARD MOUNTING SAID COMPONENT

[75] Inventors: Tsuneshi Nakamura, Hirakata; Tatsuro Kikuchi, Kyoto, both of Japan

[73] Assignee: Matsushita Electric Industrial Co., Ltd., Osaka, Japan

[21] Appl. No.: 377,997

[22] Filed: May 13, 1982

[30] Foreign Application Priority Data

May 18, 1981 [JP] Japan ................................. 56-74689

[51] Int. Cl.$^3$ .......................... H05K 1/14; H05K 3/40
[52] U.S. Cl. ...................................... 361/398; 29/837; 29/839; 361/412; 361/413; 361/388
[58] Field of Search ............... 361/397, 398, 412, 413, 361/415, 388, 395; 29/830, 831, 835, 837, 838, 839, 845

[56] References Cited

U.S. PATENT DOCUMENTS

| | | | |
|---|---|---|---|
| 2,693,584 | 11/1954 | Pifer | 361/398 X |
| 3,582,865 | 6/1971 | Franck et al. | 361/413 X |
| 3,786,439 | 10/1973 | Isaacson | 361/389 |
| 3,971,127 | 7/1976 | Giguere et al. | 361/398 X |
| 4,109,298 | 8/1978 | Hannai et al. | 361/412 |

FOREIGN PATENT DOCUMENTS 2504345 10/1982 France ................................. 29/831

OTHER PUBLICATIONS

Jerry Lyman, Flexible Circuits Bend to Designers' Will, Electronics, Sep. 1977, pp. 97 to 105.

*Primary Examiner*—R. R. Kucia
*Attorney, Agent, or Firm*—Wenderoth, Lind & Ponack

[57] ABSTRACT

A hybrid integrated circuit component for insertion in a slit of a mother printed circuit board, and a method of mounting the hybrid integrated circuit component. The circuit component includes a flexible circuit board composed of a flexible insulated substrate, a circuit conductor formed on one side of the substrate, and a pair of conductor layers formed along opposite sides of the substrate to serve as external connection terminals. Circuit elements are mounted on the substrate and electrically connected to the circuit conductor. A pair of hard supporting plates are cemented on the other surface and at the opposite sides of the substrate so that the flexible circuit board can be folded at a center bending portion of the substrate so that the supporting plates face each other and so that the connection terminals are arranged close to each other when the substrate is folded and so that the substrate at its bending portion, when folded, has a sufficient spring characteristic for ensuring contact between the slit of the mother printed circuit board and each of the connection terminals, when the connection terminals are inserted into the slit of the mother printed circuit board.

24 Claims, 11 Drawing Figures

HYBRID INTEGRATED CIRCUIT COMPONENT AND PRINTED CIRCUIT BOARD MOUNTING SAID COMPONENT

BACKGROUND OF THE INVENTION

This invention relates to a hybrid integrated circuit component, a printed circuit board on which said component is mounted, and a method of mounting the component on the board.

Recently, the need for compact, lightweight electronic equipment of various kinds, such as video equipment, has been increasing remarkably. The challenge, therefore, is to achieve miniaturization and high density of electric circuit boards which constitute such equipment. A number of methods have been adopted as a means to achieve miniaturization and high density of circuit boards for various electronic equipment. One such method is to divide the entire circuit into several blocks to highly integrate each block to create a module, which is then fitted on a mother printed circuit board together with other circuit elements and connected with each other, thereby constituting a circuit substrate.

These highly integrated circuit block modules, generally called hybrid integrated circuit components, are widely used for a variety of electronic equipment. They have played an important role in achieving not only compactness and lightness of weight but also high performance of the electronic equipment.

The conventional hybrid integrated circuit component, which has been entertaining widest acceptance is composed of a so-called "thick film circuit substrate", or alumina substrate 1, on the surface of which silver-type circuit conductors 2 and resistors are formed by means of printing; on which circuit elements 3, e.g. layered ceramic condensers, resin-moduled transistors, and integrated circuit components such as semiconductor ICs are mounted and electrically connected to form a block circuit; and which is equipped with lead wires 4 as external connection terminals. However, the above-mentioned hybrid integrated circuit component had the following disadvantages:

(1) A high density circuit is hard to materialize therefrom since the circuit block is provided on one side of the alumina substrate. Even if high density is achieved by constructing circuit blocks on both sides of the alumina substrate, the manufacturing process is very complicated and makes the component far from economical.

(2) Since lead wires are used as external connection terminals, the reliability of connection between the circuit block and lead wires is insufficient.

(3) The use of lead wires as external connection terminals hampers integration of the circuit due to complicated nature of the connection work as well as the need to provide space on the substrate constituting the block circuit for connection of lead wires.

(4) Since lead wires are used as external connection terminals, the block circuit protrudes from the level of the mother printed circuit board when mounted on the mother printed circuit board, thereby preventing the circuit substrate from being made thinner.

(5) Since an alumina substrate is used, the dimensions of the circuit block are constrained due to the limited mechanical strength of the substrate.

(6) Since a number of lead wires are connected, insertion of the terminals into the slot in the mother printed circuit board becomes difficult especially when the slot is small. On the other hand if the slot is large enough, the circuit block "floats" from the mother printed circuit board at the time of soldering.

These disadvantages have been the major obstacles to achieving miniaturization and high density of circuit substrates and improving reliability.

This invention eliminates all the above-mentioned problems.

Accordingly, an object of the present invention is to provide a hybrid integrated circuit component best suited for compact and lightweight electronic equipment.

Another object of the present invention is to provide a hybrid integrated circuit component best suited for highly reliable electronic equipment.

Still another object of the present invention is to provide a printed circuit board on which such a component is mounted, which is best suited for compact, lightweight, and highly reliable electronic equipment.

A further object of the present invention is to provide mounting methods of such a hybrid integrated circuit component on such a printed circuit board.

BRIEF DESCRIPTION OF THE DRAWINGS

These and other objects, advantages and features of the invention will become more apparent hereinafter from a consideration of the following detailed description taken in connection with the accompanying drawings in which.

DETAILED DESCRIPTION OF THE PREFERRED EMBODIMENTS

Figure 1:
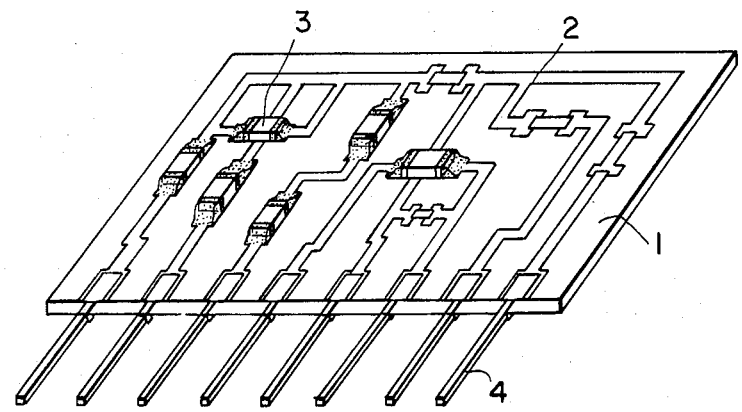
FIG. 1 is an oblique view illustrating the conventional art.
Figure 2:
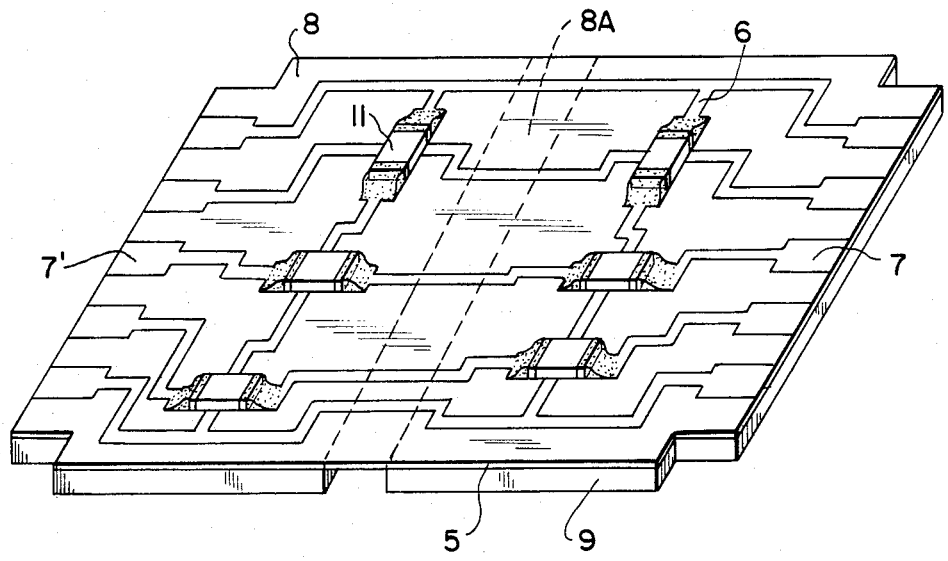
FIG. 2 is an oblique view of an example of a hybrid integrated circuit component according to this invention.
Figure 3:
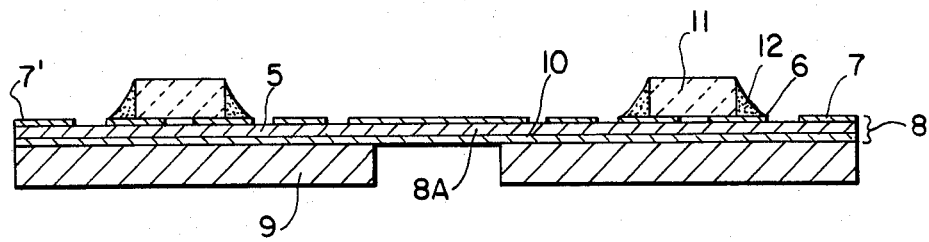
FIG. 3 is a sectional view of the same.

FIG. 2 and FIG. 3 are respectively oblique and side views of the hybrid integrated circuit component by this invention, which are provided for easier understanding of the construction of the component.

The hybrid integrated circuit component of this invention has the following construction: On one surface of a flexible insulated substrate 5, a circuit conductor 6 which constitutes a block circuit for electrically connecting the circuit elements and conductor layers 7 and 7' which are located along two opposing sides of the substrate to serve as external connection terminals are fitted to form a flexible circuit board 8. On the rear surface of the flexible circuit board 8, hard supporting plates 9 are cemented with adhesives 10 so that part of the flexible circuit board 8A can be folded freely for mounting on the mother printed circuit board as will be described. On this substrate are mounted circuit elements 11 required for the construction of the circuit block, such elements being electrically connected with the circuit conductor 6 of the flexible circuit board 8.

Since lead wires are not used, this hybrid integrated circuit component permits effective utilization of the space where the circuit elements 11 are mounted and is free of inadequate connection of lead wires. In addition, since no alumina substrate is used, there are no dimensional constrains, which allows construction of large-scale block circuits.

Furthermore, since the flexible circuit board 8 on which circuit elements 11 are fitted is folded to be mounted on the mother printed circuit board when in use, circuit elements 11 can be virtually placed on both sides of the substrate 5 via the hard supporting plate 9, thereby making it possible to effectively use the space on the mother printed circuit board, which in turn permits a high density of circuit substrate. Since the component can be fitted on the mother printed circuit board without using lead wires, the circuit substrate 5 can be made thinner. In this way, the hybrid integrated circuit component has many advantages related to circuit construction.

A specific example of this hybrid integrated circuit component follows: Polyimide film with excellent resistance to heat and bending damage is used for flexible insulated substrate 5; 35µ-thick copper foil is applied to the whole surface of the flexible substrate 5 of polyimide film; unnecessary copper foil is melted and removed by such a publicly known method as the photo-etching method; the flexible circuit board 8 is made by forming circuit conductor 6 and the conductor layers 7 and 11 function as external connection terminals on face of the polyimide film; hard supporting plates are cemented on the other face of the polyimide film with the use of urethane modified resin as an adhesive having excellent resistance to heat and bending damage so that the center of the flexible circuit board 8 can be folded freely; on the circuit conductor surface of the flexible circuit board 8 beneath which the hard supporting plates 9 are cemented, various circuit elements 11 required for block circuit construction such as leadless type resistors and condensers, miniature resin-molded transistors, and semiconductor ICs, are temporarily fixed with adhesive and then soldered. By using materials of various quality and construction for the hard supporting plates 9, depending on required characteristics of each circuit block, diverse circuit block modules can be produced.

Figure 4:
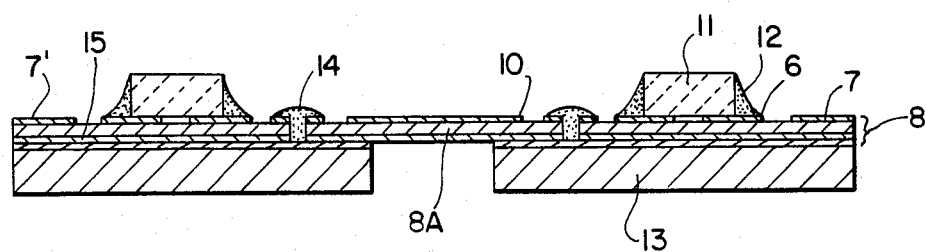
FIGS. 4 through 8 are sectional views illustrating examples of hybrid integrated circuit components according to this invention.

FIG. 4 shows a sectional drawing of another example of the hybrid integrated circuit component of the invention, wherein metal plates 13 are used as hard supporting plates cemented on the rear surface of said flexible circuit board 8. This metal plate 13 is used for maintaining dimentional stability of the substrate and for improving radiation characteristic of the circuit block, and is especially effective in constructing a circuit block using circuit elements with large power dissipation. As materials for the metal plate, aluminum, copper, iron, etc. can be used.

By this invention, it has been revealed that high-voltage circuit up to 500mW (max.) can be produced with the use of hybrid integrated circuit components having the construction described above.

However, when metal plates 13 are cemented on the rear surface of the flexible circuit board to construct a circuit block, as described in the preceding example, stray capacity is generated between the circuit conductor 6 of the flexible circuit board 8 and the metal substrate 13, which prevents the emergence of required circuit characteristics. This means that the circuit conductor of the flexible circuit board and the metal plates must be connected electrically. In such a case, holes are bored in the circuit conductor 6 of the flexible circuit board 8 so that the conductor is electrically connected with metal plates 13 by means of solder 14, as illustrated in FIG. 4.

It must be noted in this connection that solder does not adhere to aluminum or iron, so that when such materials are used for the metal plate, copper foil capable of being soldered must be cemented on the whole surface of the metal plate.

In this specific example, copper foil 15 is applied to the whole surface of the metal plate which uses aluminum, for electrical connection with the circuit conductor of the flexible circuit board.

Figure 5:
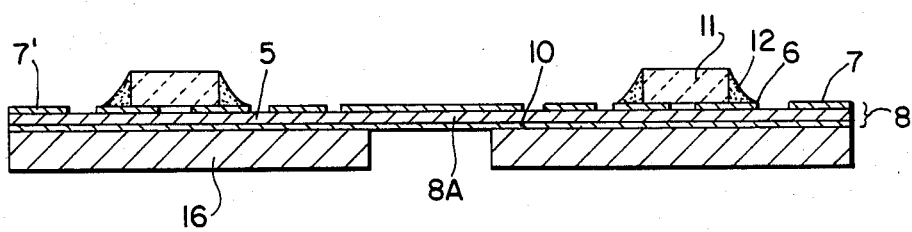

In another example as illustrated in FIG. 5, insulated substrates are used as hard supporting plates. As this insulated substrate, synthetic resin substrate 16 such as paper-phenol lamination or epoxy lamination, is used. The insulated substrate is used not only for economy but also to prevent deterioration of circuit characteristics which would otherwise be caused by soldering heat when mounting the hybrid integrated circuit component onto the mother printed circuit board by means of soldering.

Figure 6:
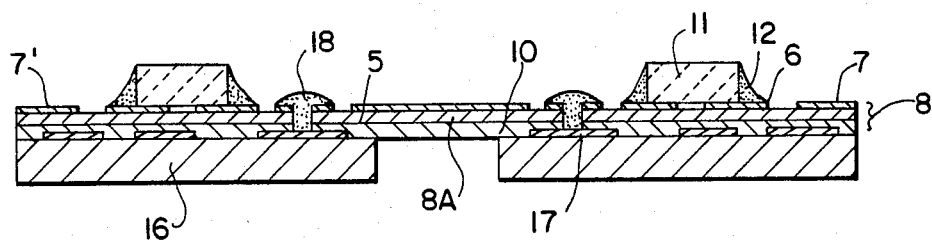

In yet another example as illustrated in FIG. 6, a multi-layered construction is made by forming a circuit-shape conductor layers 17 on the surface of the above-mentioned synthetic resin substrate 16 and by electrically connecting the circuit conductor 17 with the circuit conductor 6 of the flexible circuit board by means of soldering through the hole bored in the flexible circuit board. Such multi-layered circuit construction permits a high density circuit block to be obtained.

It was also confirmed that in addition to soldering, silver-type conductive paste can be employed for electrical connection between the circuit conductor 6 of the flexible circuit board 8 and the circuit conductor 17 on the synthetic resin substrate 16 which serves as a hard supporting plate.

Figure 7:
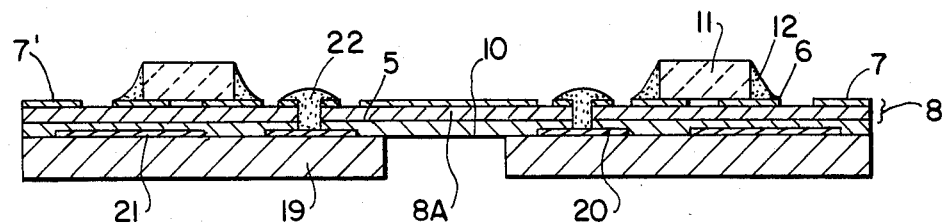

In another example as shown in FIG. 7, alumina substrate 19 is used as a insulated substrate; the thick film circuit substrate is formed by printing and burning at high temperature the silver-palladium type circuit conductor 20 and ruthenium oxide type resistor layers 21 on the surface of the alumina substrate 19; and the thus produced thick film circuit substrate is used as the hard supporting plate. Multi-layered circuit construction is made by connecting the circuit conductor 20 on the alumina substrate by means of soldering 22 through the hole bored in the circuit conductor 6 of the flexible circuit board, in order to achieve the higher density of the circuit block. It is also confirmed that the circuit conductor 6 of the flexible circuit board 8 and the circuit conductor 20 of the alumina substrate 18 can be connected with conductive paste.

Figure 8:
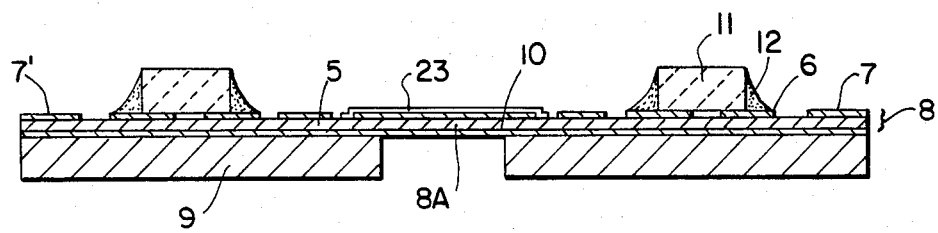

In another example of use as shown in FIG. 8, the flexible circuit board 8 constituting the hybrid integrated circuit component by this invention is so constructed that the surface of the flexible circuit board is covered with a flexible, insulating sheet 23. The purpose of this insulating sheet is to protect the circuit conductor on the flexible circuit board and to prevent disconnection of the copper foil patterns on the bending portion of the flexible circuit board. In addition, it has been revealed that the use of the insulating sheet improves the spring characteristic of the bending portion, thereby facilitating mounting of the component onto the mother printed circuit board, and plays an important role to ensure perfect soldering. Furthermore, it has been revealed that the application of the flexible insulating sheet 23 only to the bending portion of the flexible circuit board, as illustrated in FIG. 8, is effective enough, although the flexible insulating sheet may be applied to almost the entire surface of the circuit conductor on the flexible circuit board.

Figure 9:
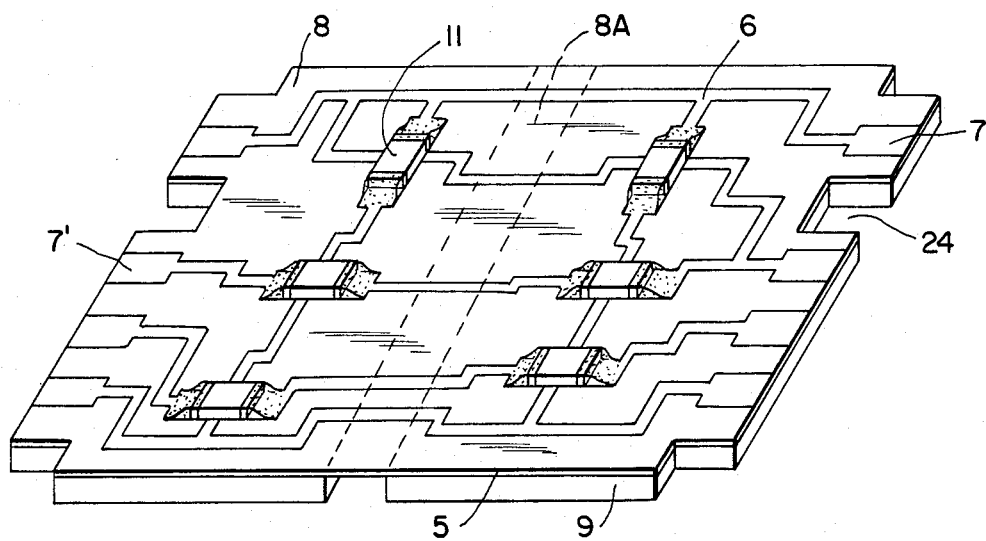
FIG. 9 is an oblique view of another example of the same.

FIG. 9 shows the construction of the external connection terminal of the hybrid integrated circuit component by this invention. This external connection terminal is characterized in that a rectangular notch is made between connection terminals which are arranged along two opposing sides of the circuit block so that the connection terminals on the right and left sides of the notch are positioned asymmetrically.

The above-mentioned terminal construction prevents the circuit block module from being mounted on the mother printed circuit board in a wrong direction.

Thus, a hybrid integrated circuit component by this invention is characterized in that: the flexible circuit board and hard supporting plates are combined skillfully; circuit elements required to constitute a block circuit are mounted on the substrate which is made by cementing hard supporting plates beneath the flexible circuit board so that part of the board can be folded freely; and the external connection terminals do not have lead wires which would otherwise be provided at equal intervals along two opposing sides of the flexible circuit board in parallel with the bending portion of the flexible circuit board.

Figure 10:
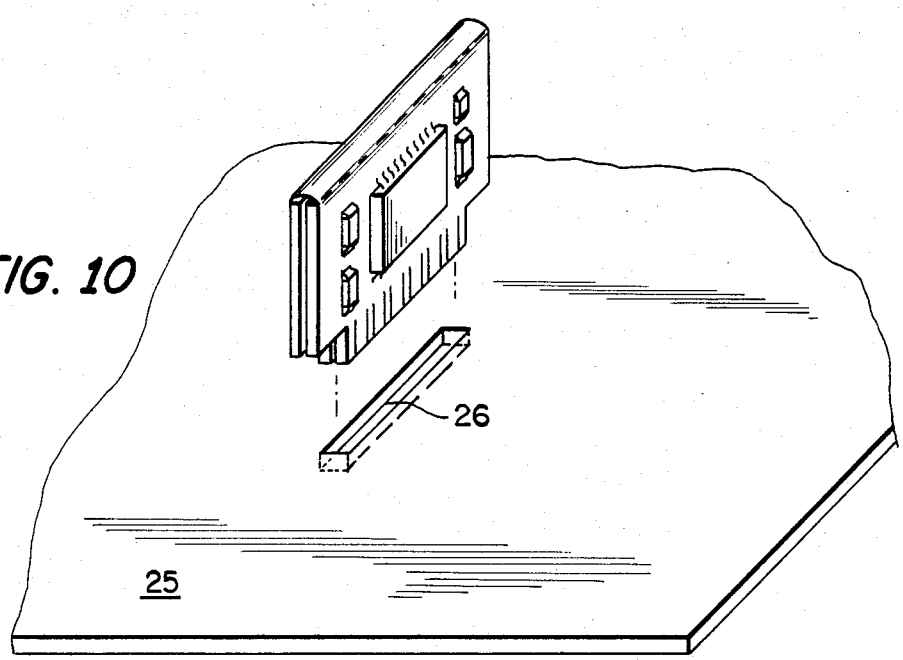
FIG. 10 is an oblique view illustrating a method of mounting a hybrid integrated circuit component according to this invention.

Accordingly, in mounting this hybrid integrated circuit component on the mother printed circuit board, the flexible circuit board 8 must be bent outwards by 180 degrees, so that the bending portion 8A of the flexible circuit board 8 on which circuit elements 11 are mounted is the center of bending and that the hard supporting plates 9 come in close contact with each other, as illustrated in FIG. 10. Then, while keeping the condition in which the circuit elements 11 are mounted on both sides of the doubled supporting plates 9, the connection terminals 7 and 7' must be inserted into the slit 26 of the mother printed circuit board 25, which must then be immersed in a molten solder bath.

The feature of the method to mount a hybrid integrated circuit component by this invention is that insertion of the connection terminals into the mother circuit board is facilitated by maintaining a large clearance between the connection terminals and the slit and that connection with the mother printed circuit board can be ensured. This is because the bending portion of the flexible circuit board has a spring characteristic.

To be more precise, the hybrid integrated circuit component by this invention before mounting on the mother printed circuit board is composed of a circuit block which is constructed on one plane. When this flexible circuit board is bent for insertion into the mother printed circuit board, the flexible circuit board tends to restore itself to its original flat state. Therefore, when the connection terminals are inserted into the slit of the mother printed circuit board, the connection terminals are in sufficient contact with the slit, even if the clearance is large. This is why "floating" of the circuit block or inadequate soldering can be completely eliminated. It has been revealed that the spring force of the flexible circuit board can be increased by applying a flexible insulating sheet onto the bending portion of the flexible circuit board as shown in FIG. 8.

Figure 11:
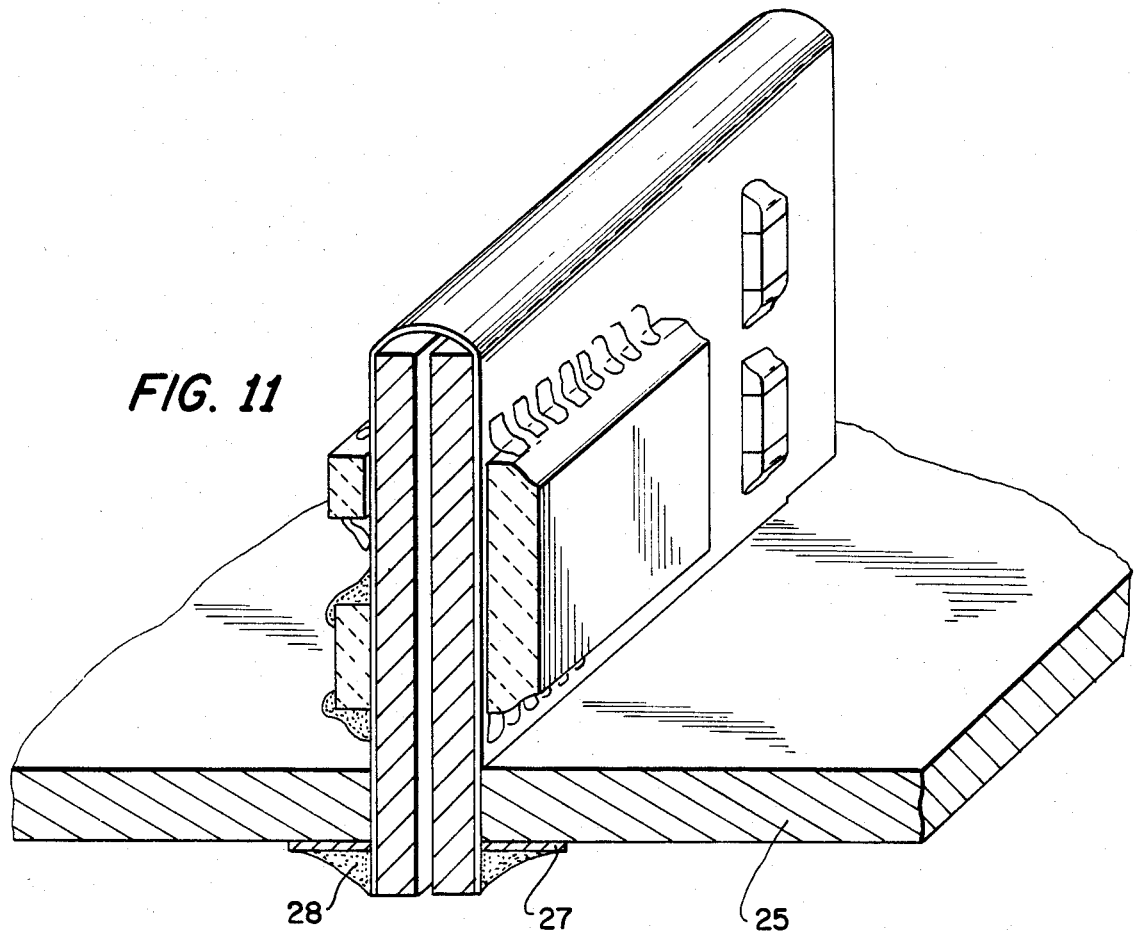
FIG. 11 is an oblique views of a mother printed circuit board on which a hybrid integrated circuit component is mounted according to this invention.

The advantages of the hybrid integrated circuit component by this invention can be best appreciated when it is mounted on a mother printed circuit board as illustrated in FIG. 11. Since the hybrid integrated circuit mounted on the mother printed circuit board is directly connected with the connection terminal of the mother printed circuit board by means of soldering, the mother printed circuit board and the circuit block can be connected firmly. In addition, since the mounted circuit block does not protrude from the mother printed circuit board, the circuit can be made thinner. Furthermore, since the circuit block is so mounted on the mother printed circuit board that the circuit block is positioned on both sides of the doubled hard supporting plates, high density on the mother printed circuit board can be achieved.

On summarizing the foregoing, the hybrid integrated circuit component by this invention is composed of a flat block circuit of leadless construction. By making the best of the characteristics of the flexible circuit board, mounting work on the mother printed circuit board is made easier and secure. Furthermore, high density and reliability are achieved as the hybrid integrated circuit component is mounted on the mother printed circuit board. Therefore, this invention makes it possible to produce compact, lightweight and highly reliable electronic equipment.

What is claimed is:

1. A hybrid integrated circuit component for insertion in a slit of a mother printed circuit board, comprising: a flexible circuit board composed of a flexible insulated substrate, a circuit conductor formed on one surface of said flexible insulated substrate, and a pair of conductor layers formed along two opposite sides of said flexible insulated substrate to serve as a pair of external connection terminals; circuit elements mounted on said flexible insulated substrate and electrically connected to said circuit conductor; and a pair of hard supporting plates cemented on the other surface and at said two opposite sides of said flexible insulated substrate so that said flexible circuit board can be folded at a center bending portion of said flexible insulated substrate so that said pair of hard supporting plates face to each other and so that said pair of external connection terminals are arranged close to each other when said flexible insulated substrate is folded and so that said flexible insulated substrate at said center bending portion, when folded, has a spring characteristic sufficient to spring said substrate outward toward a flat condition with a sufficient force to ensure contact between said slit of said mother printed circuit board and each of said pair of external connection terminals of said flexible circuit board when said pair of external connection terminals of the folded flexible insulated circuit board are inserted into said slit of said mother printed circuit board.

2. A hybrid integrated circuit component as claimed in claim 1, wherein metal plates are used as said supporting plates and said metal plates are electrically connected to said circuit conductor of said flexible circuit board.

3. A hybrid integrated circuit component as claimed in claim 1, wherein insulated substrates are used as said hard supporting plates.

4. A hybrid integrated circuit component as claimed in claim 3, wherein circuit conductor is formed on a surface of said insulated substrate used as said hard supporting plate, and this circuit conductor is electrically connected with said circuit conductor of said flexible circuit board.

5. A hybrid integrated circuit component as claimed in claim 3, wherein a circuit conductor and resistor layers are formed on a surface of said insulated substrate used as said hard supporting plate, and these circuit conductor and resistor layers are electrically connected with said circuit conductor of said flexible circuit board.

6. A hybrid integrated circuit component as claimed in claim 1, wherein the folded portion of said flexible circuit board is covered with a flexible insulating sheet.

7. A hybrid integrated circuit component as claimed in claim 6, wherein a part of said circuit conductor are covered with a flexible insulating sheet.

8. A hybrid integrated circuit component as claimed in claim 1, wherein a rectangular notch is provided asymmetrically between said pair of external connection terminals.

9. A mother printed circuit board on which hybrid integrated circuit components are mounted, each of said hybrid integrated circuit components comprising: a flexible circuit board composed of a flexible insulated substrate, a circuit conductor formed on one surface of said flexible insulated substrate, and a pair of conductor layers formed along two opposite sides of said flexible insulated substrate to serve as a pair of external connection terminals; circuit elements mounted on said flexible insulated substrate and electrically connected to said circuit conductor; and a pair of hard supporting plates cemented on the other surface and at said two opposite sides of said flexible insulated substrate, said flexible circuit board being folded and having a spring characteristic at a center bending portion of said flexible insulated substrate, and mounted on said mother printed circuit board so that said pair of hard supporting plates face to each other and so that said pair of external connection terminals are arranged close to each other and so that said pair of external connection terminals which are doubled via said pair of hard supporting plates are inserted into a slit provided on said mother printed circuit board so as to ensure contact between said slit of said mother printed circuit board and each of said pair of external connection terminals of said flexible circuit board at said center bending portion; and so that said pair of external connection terminals are directly connected to a circuit conductor of said mother printed circuit board at said slit by means of soldering; said spring characteristic being sufficient to spring said substrate outward toward a flat condition with a sufficient force to ensure contact between said slit of said mother printed board and each of said pair of external connection terminals.

10. A mother printed circuit board as claimed in claim 9, wherein metal plates are used as said hard supporting plates and said metal plates are electrically connected to said circuit conductor of said flexible circuit board.

11. A mother printed circuit board as claimed in claim 9, wherein insulated substrates are used as said hard supporting plates.

12. A mother printed circuit board as claimed in claim 11, wherein a circuit conductor is formed on a surface of said insulated substrate used as said hard supporting plate, and this circuit conductor is electrically connected with said circuit conductor of said flexible circuit board.

13. A mother printed circuit board as claimed in claim 11, wherein a circuit conductor and resistor layers are formed on a surface of said insulated substrate used as said hard supporting plate, and these circuit conductor and resistor layers are electrically connected with said circuit conductor of said flexible circuit board.

14. A mother printed circuit board as claimed in claim 9, wherein the folded portion of said flexible circuit board is covered with a flexible insulating sheet.

15. A mother printed circuit board as claimed in claim 14, wherein a part of said circuit conductor are covered with a flexible insulating sheet.

16. A mother printed circuit board as claimed in claim 9, wherein a rectangular notch is provided asymmetrically between said pair of external connection terminals.

17. A method of mounting a hybrid integrated circuit component on a mother printed circuit board, wherein said method comprises:

(a) providing a hybrid integrated circuit component comprising: a flexible circuit board composed of a flexible insulated substrate, a circuit conductor formed on one surface of said flexible insulated substrate, and a pair of conductor layers formed along two opposite sides of said flexible insulated substrate to serve as a pair of external connection terminals; circuit elements mounted on said flexible insulated substrate and electrically connected with said circuit conductor; and a pair of hard supporting plates cemented on the other surface and at said two opposite sides of said flexible insulated substrate so that said flexible circuit board can be folded at a center bending portion of said flexible insulated substrate;

(b) folding said flexible circuit board so that said pair of hard supporting plates face each other and so that said pair of external connection terminals are arranged close to each other;

(c) vertically inserting said pair of external connection terminals into a slit provided in said mother printed circuit board, said flexible circuit board being held in said slit of said mother printed circuit board with sufficient contact between said slit and each of said pair of external connection terminals thereof due to a spring characteristic of said flexible circuit board at said center bending portion; said spring characteristic being sufficient to spring said substrate outward toward a flat condition with a sufficient force to ensure contact between said slit of said mother printed board and each of said pair of external connection terminals; and (d) directly connecting said pair of external connection terminals to a circuit conductor of said mother printed circuit board at said slit by means of soldering.

18. A mounting method as claimed in claim 17, wherein metal plates are used as hard supporting plates and said metal plates are electrically connected to said circuit conductor of said flexible circuit board.

19. A mounting method as claimed in claim 17, wherein insulated substrates are used as said hard supporting plates.

20. A mounting method as claimed in claim 19, wherein a circuit conductor is formed on a surface of said insulated substrate used as said hard supporting plate, and this circuit conductor is electrically connected with said circuit conductor of said flexible circuit board.

21. A mounting method as claimed in claim 19, wherein a circuit conductor and resistor layers are formed on a surface of said insulated substrate and these circuit conductor and resistor layers are electrically connected with said circuit conductor of said flexible circuit board.

22. A mounting method as claimed in claim 17, wherein the folded portion of said flexible circuit board is covered with a flexible insulating sheet.

23. A mounting method as claimed in claim 22, wherein a part of said circuit conductor are covered with a flexible insulating sheet.

24. A mounting method as claimed in claim 17, wherein a rectangular notch is provided asymmetrically between said conductor layers which serve as external connection terminals.

* * * * *